(12) United States Patent
Ivan et al.

(10) Patent No.: US 9,257,288 B2
(45) Date of Patent: Feb. 9, 2016

(54) METHOD AND SYSTEM FOR MONITORING CRYSTALLIZATION OF AMORPHOUS SILICON THIN FILM, AND METHOD OF MANUFACTURING THIN FILM TRANSISTOR BY USING THE METHOD AND SYSTEM

(71) Applicant: Samsung Display Co., LTD., Yongin, Gyeonggi-do (KR)

(72) Inventors: Maidanchuk Ivan, Yongin (KR); Byung-Soo So, Yongin (KR); Dong-Hyun Lee, Yongin (KR); Won-Pil Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/022,126

(22) Filed: Sep. 9, 2013

(65) Prior Publication Data

US 2014/0329343 A1    Nov. 6, 2014

(30) Foreign Application Priority Data

May 2, 2013    (KR) .................. 10-2013-0049603

(51) Int. Cl.
| | | |
|---|---|---|
| *H01L 21/66* | (2006.01) | |
| *H01L 21/268* | (2006.01) | |
| *H01L 21/00* | (2006.01) | |
| *H01L 21/02* | (2006.01) | |

(52) U.S. Cl.
CPC .............. *H01L 21/268* (2013.01); *H01L 22/12* (2013.01); *H01L 21/02532* (2013.01); *H01L 21/02667* (2013.01)

(58) Field of Classification Search
None
See application file for complete search history.

(56) References Cited

U.S. PATENT DOCUMENTS

| | | | |
|---|---|---|---|
| 6,177,127 B1 * | 1/2001 | Weimer et al. .................... 427/8 |
| 6,197,623 B1 * | 3/2001 | Joo et al. ........................ 438/151 |
| 6,867,858 B2 | 3/2005 | Owen et al. |
| 2005/0199596 A1 * | 9/2005 | Takami .................. 219/121.65 |
| 2009/0086327 A1 | 4/2009 | Okumura |

FOREIGN PATENT DOCUMENTS

| | | |
|---|---|---|
| JP | 2001-094064 A | 4/2001 |
| JP | 2002-009012 A | 1/2002 |
| JP | 2002-176009 A | 6/2002 |

* cited by examiner

*Primary Examiner* — Evren Seven
(74) *Attorney, Agent, or Firm* — Christie, Parker & Hale, LLP

(57) ABSTRACT

A method and system for monitoring crystallization of an amorphous silicon (a-Si) thin film, and a method of manufacturing a thin film transistor (TFT) by using the method and system are disclosed. The method of monitoring the crystallization of the a-Si thin film includes: irradiating light from a light source onto a monitoring a-Si thin film to anneal the monitoring a-Si thin film; annealing the monitoring a-Si thin film and concurrently measuring a Raman scattering spectrum of light scattered by the monitoring a-Si thin film at set time intervals; and calculating a crystallization characteristic value of the monitoring a-Si thin film based on the Raman scattering spectrum.

7 Claims, 5 Drawing Sheets

METHOD AND SYSTEM FOR MONITORING CRYSTALLIZATION OF AMORPHOUS SILICON THIN FILM, AND METHOD OF MANUFACTURING THIN FILM TRANSISTOR BY USING THE METHOD AND SYSTEM

CROSS-REFERENCE TO RELATED APPLICATION

This application claims priority to and the benefit of Korean Patent Application No. 10-2013-0049603, filed on May 2, 2013, in the Korean Intellectual Property Office, the disclosure of which is incorporated herein in its entirety by reference.

BACKGROUND

1. Field

Aspects of embodiments of the present invention relate to a method and a system for monitoring crystallization of an amorphous silicon thin film, and a method of manufacturing a thin film transistor (TFT) by using the method and/or system.

2. Description of the Related Art

As a crystallization analysis method, a method of crystallizing amorphous silicon in a high temperature furnace using different annealing times and then analyzing the resultant crystallization of the amorphous silicon may be performed. However, this method is a destructive method due to the heating and crystallizing of the amorphous silicon in the furnace.

As another crystallization analysis method, a method using an analyzer such as Raman spectroscopic analysis (e.g., a Raman spectrometer) to analyze poly-crystalline silicon, an analysis method using an X-ray diffraction (XRD) analyzer, an analysis method using a scanning electron microscope (SEM), or the like may be performed. However, the above methods are difficult to use in mass production.

SUMMARY

Aspects of embodiments of the present invention are directed toward a method and system for simply analyzing and monitoring a process of crystallizing various kinds of amorphous silicon thin films.

According to an embodiment of the present invention, there is provided a method of monitoring crystallization of an amorphous silicon (a-Si) thin film. The method may include: irradiating light from a light source onto a monitoring a-Si thin film to anneal the monitoring a-Si thin film; annealing the monitoring a-Si thin film and concurrently measuring a Raman scattering spectrum of light scattered by the monitoring a-Si thin film at set time intervals; and calculating a crystallization characteristic value of the monitoring a-Si thin film based on the Raman scattering spectrum.

The light source may be a Raman scattering inducement laser.

The Raman scattering inducement laser may produce a laser beam having a power higher than or equal to 10 mW.

The monitoring a-Si thin film may be deposited by performing chemical vapor deposition (CVD).

The calculating of the crystallization characteristic value of the monitoring a-Si thin film may include: calculating a peak ratio between an amorphous Si peak and a polycrystalline Si peak from the Raman scattering spectrum at each of the time intervals; plotting the peak ratios to form a peak ratio pattern graph; and calculating an attenuation parameter value of an exponential decay formula as the crystallization characteristic value by using the peak ratio pattern graph.

When the attenuation parameter value matches with a reference value, an a-Si thin film prepared using conditions substantially the same as those used for the monitoring a-Si thin film may be used to manufacture a polycrystalline silicon (poly-Si) thin film transistor (TFT).

The attenuation parameter value may correspond to a peak ratio between the amorphous Si peak and the polycrystalline Si peak in a saturation state in the peak ratio pattern graph.

The calculating of the peak ratio may include: calculating the peak ratio through deconvolution to separate the amorphous Si peak and the polycrystalline Si peak from the Raman scattering spectrum.

According to another aspect of the present invention, there is provided a method of manufacturing a TFT. The method may include: irradiating light from a light source onto a monitoring a-Si thin film to anneal the monitoring a-Si thin film and concurrently measuring a Raman scattering spectrum of light scattered by the monitoring a-Si thin film; calculating a crystallization characteristic value of the monitoring a-Si thin film based on the Raman scattering spectrum; and manufacturing a polycrystalline silicon (poly-Si) TFT by preparing an a-Si thin film using conditions substantially the same as those used for the monitoring a-Si thin film when the crystallization characteristic value matches a reference characteristic value.

The light source may be a Raman scattering inducement laser.

The Raman scattering inducement laser may produce a laser beam having a power higher than or equal to 10 mW.

The monitoring a-Si thin film may be deposited by performing CVD.

According to another embodiment of the present invention, there is provided a system for monitoring crystallization of an a-Si thin film. The system may include: a light source configured to irradiate light onto a monitoring a-Si thin film to anneal the monitoring a-Si thin film; a spectroscope configured to concurrently measure a Raman scattering spectrum of light scattered by the monitoring a-Si thin film at set time intervals, the Raman scattering spectrum being measured concurrently with the annealing the monitoring a-Si thin film; and a signal processor configured to calculate a crystallization characteristic value of the monitoring a-Si thin film based on the Raman scattering spectrum.

The light source may be a Raman scattering inducement laser.

The Raman scattering inducement laser may be configured to produce a laser beam having a power higher than or equal to 10 mW.

The system may further include a focusing lens in front of the light source.

The monitoring a-Si thin film may be deposited by performing CVD.

The signal processor may be configured to calculate a peak ratio between an amorphous Si peak and a polycrystalline Si peak from the Raman scattering spectrum at each of the time intervals, plot the peak ratio at each of the time intervals to form a peak ratio pattern graph, and calculate an attenuation parameter value of an exponential decay formula as the crystallization characteristic value by using the peak ratio pattern graph.

The attenuation parameter value may correspond to a peak ratio between the amorphous Si peak and the polycrystalline Si peak in a saturation state in the peak ratio pattern graph.

The signal processor may be configured to calculate the peak ratio by performing deconvolution to separate the amorphous Si peak and the polycrystalline Si peak from the Raman scattering spectrum.

BRIEF DESCRIPTION OF THE DRAWINGS

The above and other features and aspects of the present invention will become more apparent by describing in more detail embodiments thereof with reference to the attached drawings in which.

DETAILED DESCRIPTION

Figure 1:
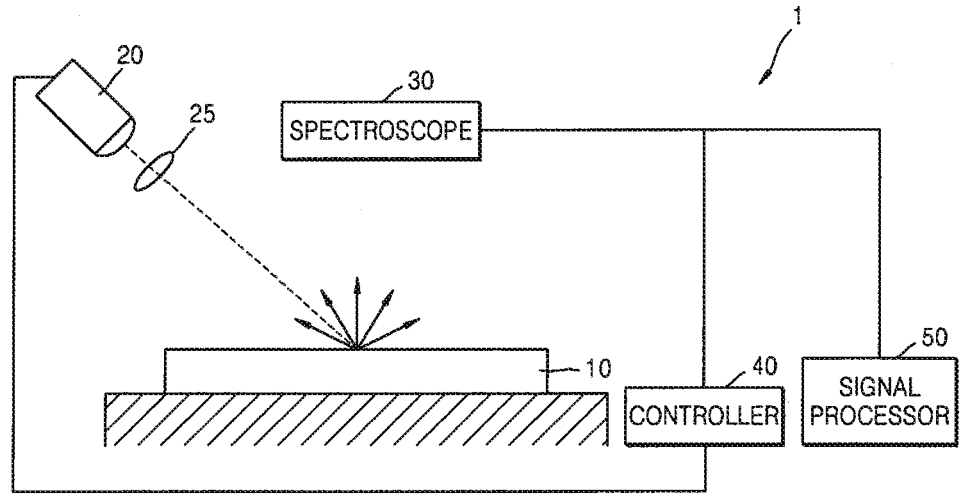
FIG. 1 is a schematic view illustrating a system for monitoring a process of crystallizing an amorphous silicon thin film, according to an embodiment of the present invention.

The present invention will now be described more fully with reference to the accompanying drawings, in which embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a schematic view illustrating a system 1 for monitoring a process of crystallizing a monitoring amorphous silicon thin film, according to an embodiment of the present invention.

An active matrix (AM) organic light-emitting display apparatus includes a pixel driving circuit in each pixel and the pixel driving circuit includes at least one thin film transistor (TFT). Amorphous silicon (a-Si) or polycrystalline silicon (poly-Si) is used as the silicon of which the TFT is formed.

When a semiconductor active layer (including a source, a drain, and a channel) is formed of amorphous silicon, an amorphous silicon TFT (a-Si TFT) used in the pixel driving circuit has low electron mobility that is lower than or equal to 1 $cm^2$/Vs. Therefore, the a-Si TFT has been replaced with a polycrystalline silicon TFT (poly-Si TED. The poly-Si TFT has higher electron mobility and higher safety in terms of light irradiation than the a-Si TFT. Therefore, the poly-Si TFT is appropriate (or highly appropriate) for use as an active layer of a driving and/or switching TFT of the AM organic light-emitting display apparatus.

Poly-Si TFTs, as described above, may be manufactured according to several methods. As an example, there is a method of depositing and crystallizing amorphous silicon. In this case, a mobility characteristic of the resultant poly-Si is related to the crystallization degree (e.g., degree of crystallization) of the polycrystalline silicon, and one method of evaluating the crystallization degree of the poly-Si is by performing Raman spectroscopy analysis. Raman spectroscopy analysis refers to a spectroscopy analysis method of applying a Raman effect of irradiating light having a single wavelength onto a material to divide (e.g., separate) scattered light in order to observe a spectral line having a slightly longer or shorter wavelength than light having the same wavelength as that of the incident light.

In the present embodiment, a monitoring amorphous silicon thin film is annealed, and concurrently (e.g., simultaneously), Raman spectroscopy analysis is performed to monitor the process of crystallizing the monitoring amorphous silicon thin film. Therefore, amorphous silicon, which has a desired or suitable crystallization condition for forming a poly-Si TFT having a particular TFT characteristic (for example, electron mobility and a threshold voltage, Vth), may be selected by monitoring the crystallization of the monitoring amorphous silicon thin film.

Referring to FIG. 1, the system 1 includes a light source 20, a spectroscope 30, a controller 40, and a signal processor 50.

The light source 20 is spaced apart from an upper surface of a monitoring a-Si thin film 10 and irradiates light toward the upper surface of the monitoring a-Si thin film 10. The light source 20 irradiates light onto a local area of the upper surface of the monitoring a-Si thin film 10. The light source 20 may be a Raman excitation laser (e.g., a Raman scattering inducement laser).

The light source 20 irradiates light to measure Raman scattering of the monitoring a-Si thin film 10 (e.g., Raman scattering caused by the monitoring a-Si thin film 10) and to perform a heating (e.g., annealing) function for crystallizing the monitoring a-Si thin film 10. If the light source 20 is a Raman excitation laser, the Raman excitation laser is to be focused (e.g., accurately focused) to heat a local portion of the monitoring a-Si thin film 10 at (or to) a predetermined (e.g., set) temperature. For example, a focusing lens 25 is arrayed in front of the Raman excitation laser to focus a laser beam in order to heat the monitoring a-Si thin film 10 at a power higher than or equal to 10 mW (e.g., the Raman scattering inducement laser produces a laser beam having a power level higher than or equal to 10 mW). As a result, the light source 20 concurrently (e.g., simultaneously) performs Raman scattering inducement and annealing of the monitoring a-Si thin film 10, and thus an additional crystallization apparatus for crystallizing the monitoring a-Si thin film 10 is not required.

The spectroscope 30 is spaced apart from the upper surface of the monitoring a-Si thin film 20 and measures a Raman scattering spectrum of light scattered on (e.g., scattered by) the upper surface of the monitoring a-Si thin film 10. For example, the spectroscope 30 measures the Raman scattering spectrum at predetermined (e.g., set) time intervals.

The controller 40 controls a movement, a power, an irradiation time, etc. of the light source 20, and controls a setting value for measuring the movement and for obtaining a spectrum using the spectroscope 30.

The controller 40 controls a position movement of the light source 20 so that light irradiated from the light source 20 is focused in a local area of the monitoring a-Si thin film 10. The controller 40 also controls the power and the irradiation time of the light source 20 according to an annealing temperature and an annealing time of the monitoring a-Si thin film 10. The controller 40 controls a position movement of the spectroscope 30 so that the spectroscope 30 concentrates the light scattered from the monitoring a-Si thin film 10. The controller 40 sets a parameter to allow the spectroscope 30 to measure a spectrum from the scattered light.

The signal processor 50 receives the Raman scattering spectrum measured at each time interval by the spectroscope 30 and analyzes the Raman scattering spectrum. The signal processor 50 calculates a crystallization characteristic value of the monitoring a-Si thin film 10 based on the Raman scattering spectrum.

The signal processor 50 calculates a peak ratio between an amorphous Si peak and a polycrystalline Si peak from the Raman scattering spectrum at each predetermined (e.g., set) time interval (e.g., annealing time interval). Here, the signal processor 50 calculates the peak ratio through deconvolution to separate the amorphous Si peak and the polycrystalline Si peak from the Raman scattering spectrum. The signal processor 50 plots the peak ratio at each time interval to form a peak ratio pattern graph. The signal processor 50 applies an exponential decay formula, an example of which is described below, to a value of the peak ratio pattern graph to calculate an attenuation parameter value as the crystallization characteristic value. The attenuation parameter value corresponds to the peak ratio between the amorphous Si peak and the polycrystalline Si peak in a saturation state on the peak ratio pattern graph, as described in more detail below.

Figure 2:
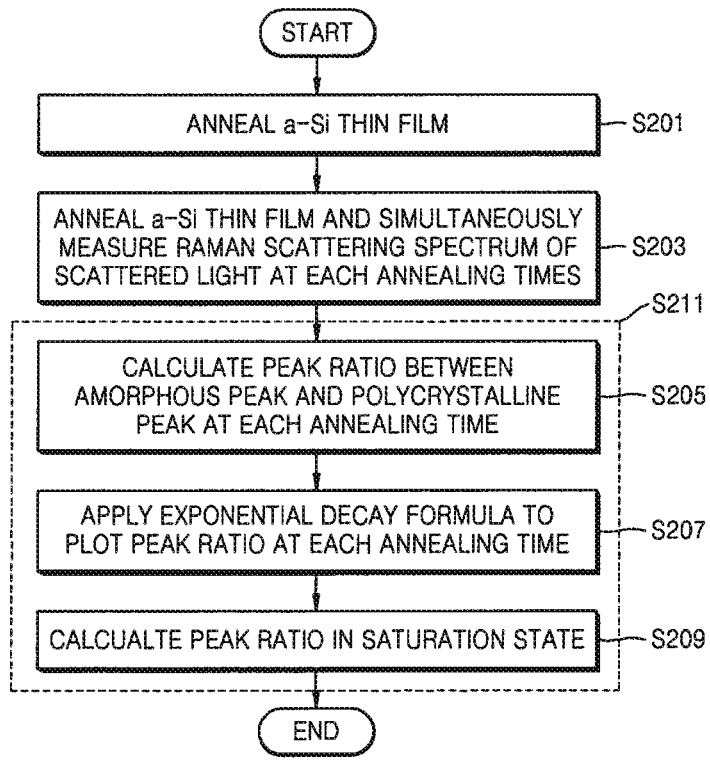
FIG. 2 is a schematic flowchart illustrating a method of monitoring a process of crystallizing an amorphous silicon thin film, according to an embodiment of the present invention.

FIG. 2 is a schematic flowchart illustrating a method of monitoring a process of crystallizing a monitoring a-Si thin film, according to an embodiment of the present invention.

Referring to FIG. 2, in operation S201, light is irradiated onto the monitoring a-Si thin film to anneal the monitoring a-Si thin film.

The monitoring a-Si thin film may be deposited by using a chemical vapor deposition (CVD) method such as catalyst CVD or plasma CVD (PCVD). According to the CVD method, $SiH_4$ and $H_2$ may be supplied as source gases into a deposition chamber to deposit a hydrogenated a-Si thin film on a substrate. Here, film forming conditions, such as a ratio between $H_2$ and $SiH_4$, amounts of $H_2$ and $SiH_4$, layer forming power, pressure, layer thickness, etc., may be adjusted to adjust characteristics of the monitoring a-Si thin film. For example, a deposition rate of the monitoring a-Si thin film, i.e., a deposition time of the monitoring a-Si thin film per second, may vary according to the film forming conditions. Therefore, the characteristics of the monitoring a-Si thin film, for example, bonding structures and chemical compositions of Si—H and Si—Si may vary according to the deposition conditions of the monitoring a-Si thin film.

A crystallization speed of an a-Si thin film may vary according to the characteristics of the a-Si thin film. Therefore, the characteristics of a poly-Si thin film formed by the crystallization of an a-Si thin film may vary. As a result, the characteristics of a poly-Si TFT manufactured using a poly-Si thin film may also vary.

In the present embodiment, the process of crystallizing the monitoring a-Si thin film is monitored to select optimum (or desirable) conditions for preparing an a-Si thin film for manufacturing a poly-Si TFT.

Also, in the present embodiment, a Raman scattering inducement laser may be used as a light source to anneal the monitoring a-Si thin film. The Raman scattering inducement laser heats a local portion of an upper surface of the monitoring a-Si thin film at a power higher than or equal to 10 mW (e.g., using a laser beam having a power level higher than or equal to 10 mW) to anneal the monitoring a-Si thin film at (or to) a predetermined (e.g., set) temperature and to concurrently (e.g., simultaneously) generate scattered light from the monitoring a-Si thin film.

In operation S203, the monitoring a-Si thin film is annealed, and, concurrently (e.g., simultaneously), a Raman scattering spectrum of the scattered light is measured from the monitoring a-Si thin film by using a spectroscope. Since the monitoring a-Si thin film is annealed while the scattered light is measured, the spectroscope concurrently (e.g., simultaneously) measures Raman scattering light in an amorphous state and Raman scattering light in a crystallized state.

Figure 3:
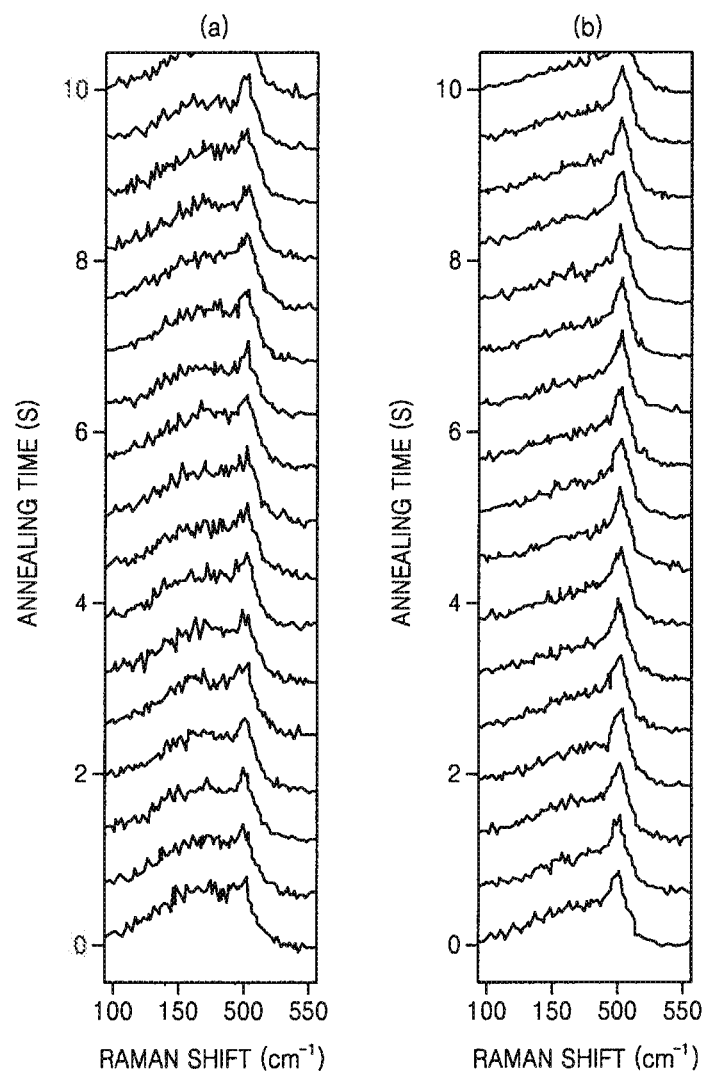
FIGS. 3A and 3B are graphs illustrating Raman spectrums measured with respect to different amorphous silicon thin films, according to embodiments of the present invention.

FIGS. 3A and 3B are graphs illustrating Raman scattering spectrums measured with respect to different a-Si thin films, according to embodiments of the present invention.

FIGS. 3A and 3B illustrate results of Raman scattering spectrums measured at predetermined (e.g., set) time intervals while irradiating a laser beam of 10 mW onto two a-Si thin film samples having different material characteristics and thicknesses and annealing the two a-Si thin film samples.

In FIGS. 3A and 3B, a horizontal axis denotes a Raman shift ($cm^{-1}$), and a vertical axis denotes an annealing time (s) of an a-Si thin film, i.e., a light source irradiation time. As shown in FIGS. 3A and 3B, intensities of scattered light are expressed as Raman scattering spectrums at set time intervals (e.g., annealing times).

Referring to FIGS. 3A and 3B, a peak having a large width appears around 480 $cm^{-1}$, and a sharp peak appears between 510 $cm^{-1}$ and 520 $cm^{-1}$. The peak around 480 $cm^{-1}$ is a peak (hereinafter referred to as an amorphous Si peak) of an a-Si thin film, and the peak between 510 $cm^{-1}$ and 520 $cm^{-1}$ is a peak (hereinafter referred to as a polycrystalline Si peak) of a poly-Si thin film.

Shapes of the Raman scattering spectrums of FIGS. 3A and 3B are different from each other. In other words, the shapes of the Raman scattering spectrums may be different according to a material characteristic and/or a thickness of the a-Si thin film. Therefore, the Raman scattering spectrums measured at the set time intervals (e.g., annealing times) may be analyzed to monitor a process of crystallizing a-Si.

Referring back to FIG. 2, in operation S211, a crystallization characteristic value of the monitoring a-Si thin film is calculated based on the Raman scattering spectrum.

In more detail, in operation S205, a peak ratio between an amorphous Si peak and a polycrystalline Si peak is calculated from the Raman scattering spectrum at each time interval (e.g., annealing time). The peak ratio between the amorphous Si peak and the polycrystalline Si peak may be calculated by performing deconvolution to separate the amorphous Si peak and the polycrystalline Si peak from the Raman scattering spectrum.

In operation S207, the peak ratio between the amorphous Si peak and the polycrystalline Si peak at each time interval (e.g., annealing time) is plotted at each predetermined (e.g., set) time interval (e.g., annealing time interval) to form a peak ratio pattern graph.

In operation S209, the peak ratio pattern graph is used to calculate an attenuation parameter value as a crystallization characteristic value. The attenuation parameter value corresponds to the peak ratio between the amorphous Si peak and the polycrystalline Si peak in a saturation state on the peak ratio pattern graph.

An exponential decay formula applied in the present embodiment is as Equation 1 below. Here, C denotes a peak ratio at a time t, b is a constant, and $t_0$ is an initial time.

$$C = A_0 \exp\left(\frac{b}{t + t_o}\right) \quad (1)$$

An attenuation parameter $A_0$ corresponds to a C value when t is infinite, i.e., a peak ratio in a saturation state on the peak ratio pattern graph. A value of the attenuation parameter $A_0$ varies according to a kind of a-Si thin film (e.g., the attenuation parameter varies according to the deposition conditions of the a-Si thin film). The exponential decay formula may be applied to the peak ratio pattern graph according to annealing times to acquire the attenuation parameter $A_0$, the constant b, and the time $t_0$, each of which converges on a particular value.

Figure 4:
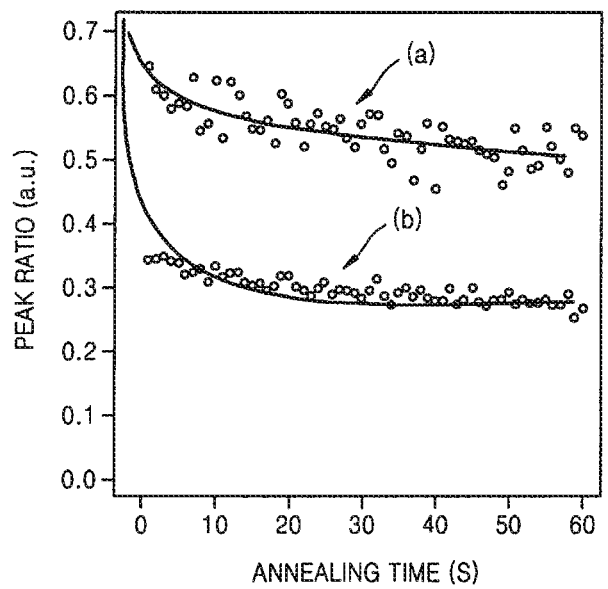
FIG. 4 is a graph illustrating peak ratio patterns formed (e.g., data points obtained) with respect to different amorphous silicon thin films, according to embodiments of the present invention.

FIG. 4 is a graph illustrating a peak ratio pattern formed with respect to different a-Si thin films, according to an embodiment of the present invention.

In FIG. 4, a horizontal axis denotes an annealing time of an a-Si thin film, and a vertical axis denotes a peak ratio between an amorphous Si peak and a polycrystalline Si peak.

Referring to FIG. 4, if the peak ratio is plotted according to the annealing time, the peak ratio converges on a particular value as time passes. If each coordinate value of a peak ratio pattern graph drawn from the plotted peak ratio is substituted into the exponential decay formula of Equation 1, values of $A_0$, b, and $t_0$ of the exponential decay formula each converge on a particular value as time passes. FIG. 4 illustrates the peak ratio pattern graph formed with respect to different a-Si thin films. As shown in FIG. 4, the value of $A_0$ in saturation states of the different a-Si thin films varies.

Figure 5:
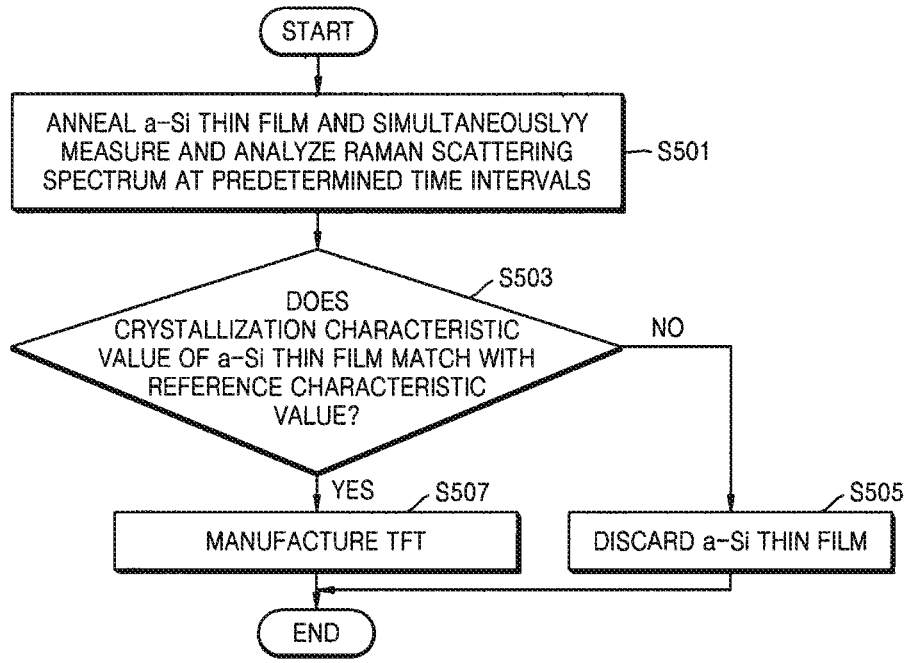
FIG. 5 is a flowchart illustrating a method of manufacturing a thin film transistor (TFT), according to an embodiment of the present invention.

FIG. 5 is a flowchart illustrating a method of manufacturing a TFT, according to an embodiment of the present invention.

An a-Si thin film is deposited on a substrate according to a predetermined (e.g., set) film forming condition.

In operation S501, a light source is irradiated onto a monitoring a-Si thin film to anneal the monitoring a-Si thin film and to measure and analyze a Raman scattering spectrum at predetermined (e.g., set) time intervals (e.g., annealing time intervals) as the annealing time progresses. The light source may be a Raman scattering inducement laser and may heat the monitoring a-Si thin film at a power of about 10 mW or more to anneal the monitoring a-Si thin film at a predetermined (e.g., set) temperature. Scattered light is collected from the monitoring a-Si thin film by using a spectroscope concurrently (e.g., simultaneously) while annealing to measure a Raman scattering spectrum at each predetermined (e.g., set) time interval (e.g., annealing time interval). A peak ratio between an amorphous Si peak and a polycrystalline Si peak is calculated from the Raman scattering spectrum measured at each time interval (e.g., annealing time interval), and a peak ratio in a saturation state is calculated as a crystallization characteristic value of the monitoring a-Si thin film based on the calculated peak ratio. The measurement and analysis of the Raman scattering spectrum of the monitoring a-Si thin film have been described above with reference to FIGS. 1 through 4, and thus their detailed descriptions will not be repeated here.

In operation S503, the crystallization characteristic value of the monitoring a-Si thin film is compared with a reference characteristic value to determine whether the crystallization characteristic value of the monitoring a-Si thin film matches with the reference characteristic value.

If the crystallization characteristic value of the monitoring a-Si thin film is different from the reference characteristic value, the monitoring a-Si thin film is discarded in operation S505.

In operation S507, if the crystallization characteristic value of the monitoring a-Si thin film matches with the reference characteristic value, a poly-Si TFT is manufactured by using an a-Si thin film prepared using the same (or substantially the same) conditions as those used for the monitoring a-Si thin film.

In the present embodiment, a monitoring a-Si thin film, which has a crystallization characteristic value corresponding to a characteristic of a poly-Si TFT to be manufactured, may be selected. An a-Si thin film is deposited on a substrate under a film forming condition of the selected monitoring a-Si thin film and crystallized using the same or substantially the same conditions under which the selected monitoring a-Si thin film was crystallized to prepare a poly-Si thin film to manufacture a TFT.

Figure 6:
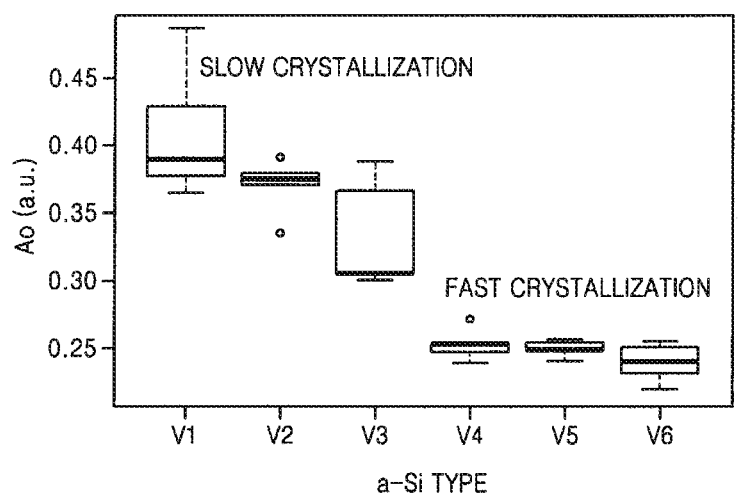
FIG. 6 is a graph illustrating attenuation parameters calculated with respect to various kinds of amorphous silicon thin films, according to embodiments of the present invention.

FIG. 6 is a view illustrating an attenuation parameter $A_0$ calculated with respect to various kinds of a-Si thin films, according to an embodiment of the present invention.

Referring to FIG. 6, annealing is performed a plurality of times and Raman scattering spectrums are concurrently (e.g., simultaneously) measured with respect to first, second, third, fourth, fifth, and sixth a-Si thin films referred to as V1, V2, V3, V4, V5, and V6, respectively. Also, attenuation parameters $A_0$ are calculated with respect to the first, second, third, fourth, fifth, and sixth a-Si thin films V1, V2, V3, V4, V5, and V6.

A topside of a rectangle denotes a maximum value "Max" of the attenuation parameter $A_0$, a lower base of the rectangle denotes a minimum value "Min" of the attenuation parameter $A_0$, and a thick line denotes an average value "Avg" for the plurality of times that annealing is performed. In other words, attenuation values $A_0$ of a-Si thin films having different structures and different chemical compositions may differ from one another according to a film forming condition of the a-Si thin film.

The first, second, and third a-Si thin films V1, V2, and V3, respectively, have greater attenuation parameters $A_0$ than the fourth, fifth, and sixth a-Si thin films V4, V5, and V6, respectively. As the attenuation parameters $A_0$ are greater (increase), crystallization speeds are lower. Therefore, the first, second, and third a-Si thin films V1, V2, and V3, respectively, are crystallized at slow speeds (e.g., relatively lower speeds), and the fourth, fifth, and sixth a-Si thin films V4, V5, and V6, respectively, are crystallized at high speeds (e.g., relatively higher speeds).

Figure 7:
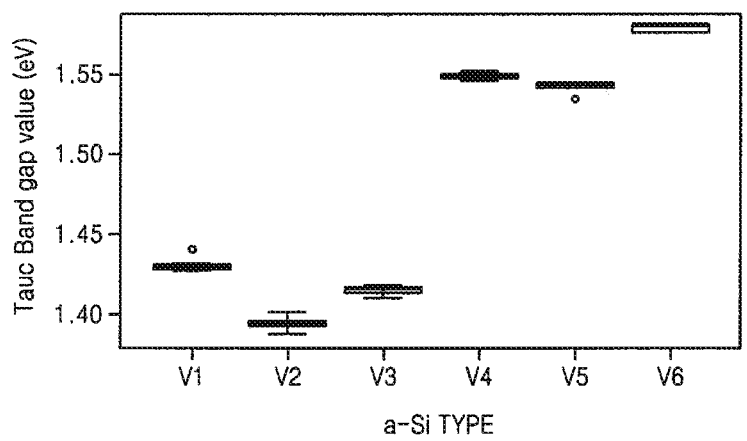
FIG. 7 is a graph illustrating Tauc band gap values measured with respect to the six kinds of amorphous silicon thin films of FIG. 6 obtained by using a spectral ellipsometer.

FIG. 7 is a comparison example view illustrating Tauc band gap values measured with respect to the six kinds of a-Si thin films of FIG. 6 by using a spectral ellipsometer.

Referring to FIG. 7, a topside of a rectangle denotes a maximum value "Max" of the Tauc band gap, a lower base denotes a minimum value "Min" of the Tauc band gap, and a thick line denotes an average value "Avg" for the plurality of times that annealing is performed. In other words, Tauc band gap values of a-Si thin films having different structures and different chemical compositions are different according to a film forming condition of the a-Si thin film.

The first, second, and third a-Si thin films V1, V2, and V3, respectively, have small Tauc band gap values, and the fourth, fifth, and sixth a-Si thin films V5, V6, and V7, respectively, have relatively large Tauc band gap values.

Figure 8:
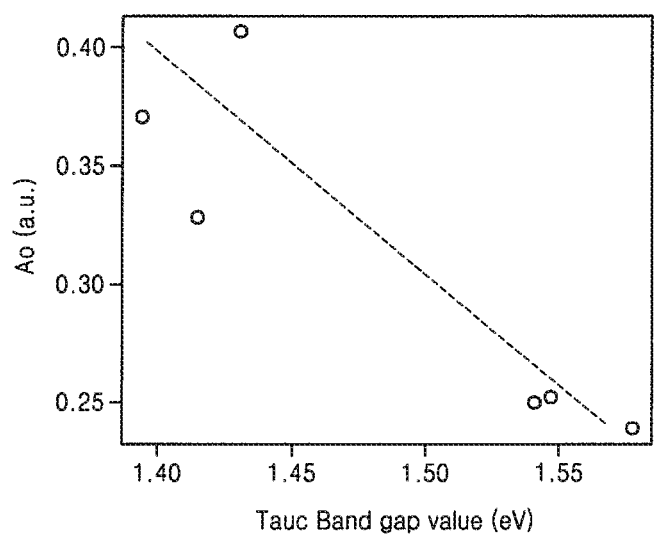
FIG. 8 is a graph illustrating a correlation between an attenuation parameter $A_0$ and a Tauc band gap value.

FIG. 8 is a graph illustrating a correlation between the attenuation values $A_O$ of FIG. 6 and the Tauc band gap values of FIG. 7.

Referring to FIG. 8, a crystallization characteristic analysis result of an a-Si thin film by using the attenuation parameter $A_O$ calculated in the embodiment of FIG. 6 is antisymmetric with respect to a band gap analysis result of an a-Si thin film calculated in the comparison example of FIG. 7.

In other words, the first, second, and third a-Si thin films V1, V2, and V3, respectively, having relatively small band gap values are crystallized at low speeds. The fourth, fifth, and sixth a-Si thin films V4, V5, and V6, respectively, having relatively large band gap values are crystallized at high speeds (e.g., relatively higher speeds).

A system for monitoring crystallization of an a-Si thin film according to embodiments of the present invention does not need an additional laser apparatus for crystallizing the monitoring a-Si thin film. The system also crystallizes the monitoring a-Si thin film and concurrently (e.g., simultaneously) measures a Raman scattering spectrum by using a Raman scattering inducement laser for Raman spectral analysis. Therefore, the system according to embodiments of the present invention nondestructively, quickly, and simply monitors and analyzes a process of crystallizing the monitoring a-Si thin film.

Also, the Raman spectral analysis is performed at predetermined (e.g., set) time intervals when annealing is performed. Therefore, the process of crystallizing the monitoring a-Si thin film is analyzed to determine a crystallization characteristic of the monitoring a-Si thin film in order to ensure reliability.

As described above, according to embodiments of the present invention, a high power Raman scattering inducement laser beam is irradiated onto a monitoring a-Si thin film to anneal the monitoring a-Si thin film and concurrently (e.g., simultaneously) measure a Raman scattering spectrum of the monitoring a-Si thin film. Therefore, a process of crystallizing various kinds of a-Si thin films is simply and quickly monitored.

While the present invention has been particularly shown and described with reference to certain embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing a thin film transistor (TFT), the method comprising:
   irradiating light from a light source onto a monitoring amorphous silicon (a-Si) thin film to anneal the monitoring a-Si thin film and concurrently measuring a Raman scattering spectrum of light irradiated from the light source and scattered by the monitoring a-Si thin film;
   calculating a crystallization characteristic value of the monitoring a-Si thin film based on the Raman scattering spectrum; and
   manufacturing a polycrystalline silicon (poly-Si) TFT by preparing an a-Si thin film using conditions the same as those used for the monitoring a-Si thin film when the crystallization characteristic value matches a reference characteristic value,
   wherein the measuring of the Raman scattering spectrum of the light irradiated from the light source and scattered by the monitoring a-Si thin film is performed at set time intervals, and
   wherein the calculating of the crystallization characteristic value of the monitoring a-Si thin film comprises:
   calculating a peak ratio between an amorphous Si peak and a polycrystalline Si peak from the Raman scattering spectrum at each of the time intervals;
   plotting the peak ratios to form a peak ratio pattern graph; and
   calculating an attenuation parameter value of an exponential decay formula as the crystallization characteristic value by using the peak ratio pattern graph.

2. The method of claim 1, wherein the light source is a Raman scattering inducement laser.

3. The method of claim 2, wherein the Raman scattering inducement laser produces a laser beam having a power higher than or equal to 10 mW.

4. The method of claim 1, wherein the monitoring a-Si thin film is deposited by performing chemical vapor deposition (CVD).

5. The method of claim 1, wherein when the attenuation parameter value matches a reference value, an a-Si thin film prepared using conditions the same as those used for the monitoring a-Si thin film is used to manufacture a polycrystalline silicon (poly-Si) thin film transistor (TFT).

6. The method of claim 1, wherein the attenuation parameter value corresponds to a peak ratio between the amorphous Si peak and the polycrystalline Si peak at a saturation state in the peak ratio pattern graph.

7. The method of claim 1, wherein the calculating of the peak ratio comprises:
   calculating the peak ratio through deconvolution to separate the amorphous Si peak and the polycrystalline Si peak from the Raman scattering spectrum.

* * * * *